(12) United States Patent
Hoge et al.

(10) Patent No.: US 7,869,639 B2
(45) Date of Patent: Jan. 11, 2011

(54) MAGNETIC RESONANCE IMAGING BY SUBSPACE PROJECTION

(75) Inventors: William Scott Hoge, Brookline, MA (US); Misha Kilmer, Medfield, MA (US)

(73) Assignee: The Brigham and Women's Hospital, Inc., Boston, MA (US)

(*) Notice: Subject to any disclaimer, the term of this patent is extended or adjusted under 35 U.S.C. 154(b) by 993 days.

(21) Appl. No.: 11/625,661

(22) Filed: Jan. 22, 2007

(65) Prior Publication Data
US 2008/0175451 A1 Jul. 24, 2008

(51) Int. Cl.
G06K 9/00 (2006.01)
(52) U.S. Cl. .................................................... 382/128
(58) Field of Classification Search .................. 382/128
See application file for complete search history.

(56) References Cited

U.S. PATENT DOCUMENTS

| | | | | |
|---|---|---|---|---|
| 5,546,472 | A * | 8/1996 | Levin | 382/131 |
| 6,208,139 | B1 * | 3/2001 | Foo et al. | 324/309 |
| 6,680,610 | B1 * | 1/2004 | Kyriakos et al. | 324/307 |
| 6,748,096 | B2 * | 6/2004 | Chuang | 381/395 |
| 6,975,900 | B2 * | 12/2005 | Rudy et al. | 600/523 |
| 2001/0038285 | A1 * | 11/2001 | Zhu | 324/309 |
| 2003/0120163 | A1 * | 6/2003 | Rudy et al. | 600/509 |
| 2004/0082870 | A1 * | 4/2004 | Rudy et al. | 600/509 |
| 2005/0270024 | A1 * | 12/2005 | Lin | 324/307 |
| 2007/0297656 | A1 * | 12/2007 | DeMan et al. | 382/128 |
| 2008/0012564 | A1 * | 1/2008 | Lin | 324/309 |
| 2008/0107319 | A1 * | 5/2008 | Chang et al. | 382/131 |

OTHER PUBLICATIONS

"Fast Regularized Reconstruction of Non-Uniformly Subsampled Parallel MRI Data", Hoge et al, 3rd IEEE International Symposium on Biomedical Imaging: Nano to Macro, 2006, pp. 714-717.*
"Choosing Regularization Parameters in Iterative Methods for Ill-Posed Problems", Misha E. Kilmer and Dianne P. O'Leary, SIAM J. Matrix Anal. Appl. vol. 22, No. 4, pp. 1204-1221, 2001.*
Martin Blaimer et al., "SMASH, SENSE, PILS, GRAPPA How to Choose the Optional Method," *Top Magn Reson Imaging*, vol. 15(4), pp. 223-236, (Aug. 2004).
W. Scott Hoge, "Fast Regularized Reconstruction of non-Unofirmaly Subsampled Parallel MRI Data," (May 2006).
Hoge et al., "An Iterative Method for Fast Regularized Parallel MRI Reconstruction," Poster on Method presented at ISMRM06, May 8-12, 2006 (submitted Nov. 17, 2005).
Misha Kilmer, et al., "Choosing Regularization Parameters in Interactice Methods for Ill-Posed Problems," *SIAM J. Matrix Anal. Appl.*, vol. 22(4), pp. 1204-1221 (2001).

(Continued)

*Primary Examiner*—Wenpeng Chen
(74) *Attorney, Agent, or Firm*—Fish & Richardson P.C.

(57) ABSTRACT

Reconstructing an image from MRI data provided by an MRI machine includes: selecting a system transformation based on the MRI machine; selecting a subspace based on the system transformation; and obtaining a solution vector that solves a minimization problem. The minimization problem is formulated on the subspace, based on the MRI data. The image is reconstructed from the solution vector and displayed.

38 Claims, 7 Drawing Sheets

OTHER PUBLICATIONS

Misha Kilmer et al., "Recycling Subspace Information for Diffused Optical Tomography," *SIAM J. on Sci. Comput.*, vol. 27(6), pp. 2140-2166, (Dec. 2006) (Published on-line in electronic form Mar. 2006). Results presented first at Cooper Mountain 2004.

Fa-Hsuan Lin et al., "Parallel Imaging Reconstructions Using Automatic Regularization," *Magn. Reson. Med.*, vol. 15(3), pp. 559-567, (Mar. 2004).

Klaas P. Pruessmann et al., "Advances in Sensitivity Encoding with Abitrary K-Space Trajectories," *Magn. Reson. Med.*, vol. 46(4), pp. 638-651, (Oct. 2001).

\* cited by examiner

MAGNETIC RESONANCE IMAGING BY SUBSPACE PROJECTION

REFERENCE TO GOVERNMENT SUPPORT

This invention was made with Government support under Grant No. RRO19703 awarded by the National Institutes of Health. The U.S. Government has certain rights in this invention.

FIELD OF DISCLOSURE

This disclosure relates to magnetic resonance imaging (MRI), and in particular, to image reconstruction.

BACKGROUND

One way to generate an image of the interior of an opaque structure makes use of a phenomenon known as nuclear magnetic resonance (NMR). Generally, NMR is a phenomenon by which atoms absorb energy provided from an external magnetic field, and subsequently radiate the absorbed energy as photons. By controlling the magnetic field throughout a region, one can control the frequency and phase of the emitted photons to vary as a function of the emitting atom's position in the region. Therefore, by measuring the emitted photons' frequency and phase, one can tell where the atoms are present inside the region.

In FIG. 1, one way to represent the data gathered from the resonant atoms is by constructing a k-space dataset 100. Each radiated photon is characterized by its wave number (often denoted k) or equivalently its frequency, and its phase relative to a reference phase. The k-space dataset 100 is a plot of the number of photons detected with a particular wave number and a particular phase. Often, k-space dataset 100 is represented as a two-dimensional array of pixels that have varying intensities. Dark pixels indicate that a relatively small number of photons were detected at the particular wave number and phase, and bright pixels indicate that a relatively large number of photons were detected at the particular wave number and phase.

An image 102 can be reconstructed from the k-space dataset 100 by various mathematical techniques. These techniques are useful for imaging the internal structure of a human being. In this context, the hydrogen atoms that make up the human's body are caused to undergo nuclear magnetic resonance. In the context of imaging the hydrogen in a human or other animal, this technique is sometimes referred to as magnetic resonance imaging (MRI). Since hydrogen is present in nearly every organ, tissue, fluid, or other part of a human being, MRI typically provides a relatively detailed image of the human being through non-invasive means.

In some MRI contexts, it is desirable to quickly acquire the k-space data necessary to produce an image. For example, when imaging a patient's heart, the image quality is often enhanced if the patient suppresses respiratory-induced motion by holding his breath while the k-space data is acquired. Some patients experience discomfort or difficulty holding their breath for extended periods of time, particularly patients who are in need of cardiac imaging.

One way to reduce the time required to acquire the k-space data is to employ multiple detectors, with each detector configured to detect photons from different spatial regions. This approach is referred to as "parallel" MRI, or pMRI.

SUMMARY

In general, in one aspect, reconstructing an image from MRI data provided by an MRI machine includes: selecting a system transformation based on the MRI machine; selecting a subspace based on the system transformation; obtaining a solution vector that solves a minimization problem, the minimization problem being formulated on the subspace based on the MRI data; and displaying the image reconstructed from the solution vector.

Reconstructing an image also includes estimating a sensitivity of a receiving coil in the MRI machine, and selecting the system transformation includes selecting the system transformation based on the sensitivity. Selecting the system transformation also includes selecting the system transformation based on a sampling pattern used by the MRI machine. Obtaining a solution vector includes selecting a regularization parameter, and the subspace is selected independently of the regularization parameter. Reconstructing an image also includes selecting a basis of the subspace. The basis is selected using a conjugate-gradient least-square technique. The basis is selected using an least-squares QR technique. Obtaining a solution vector includes selecting a regularization parameter, and the basis is selected independently of the regularization parameter. The subspace consists of a Krylov subspace. Obtaining a solution vector includes using an LSQR algorithm. Obtaining a solution vector includes using a conjugate-gradient algorithm. Reconstructing an image also includes selecting a regularization parameter corresponding to a substantially vertical portion of an L-curve. Reconstructing an image also includes selecting a first regularization parameter and a second regularization parameter. The first regularization parameter corresponds to a real part of the solution vector, and the second regularization parameter corresponds to an imaginary part of the solution vector. The first regularization parameter and the second regularization parameter are selected as maximum parameters yielding a pre-determined error. The first and second regularization parameters are selected from an interval, the interval being based on a singular value spectrum of the system transformation. The interval consists of numbers between $10^2$ and $10^6$. The MRI data is acquired by uniformly sampling a k-space. The MRI data is acquired by non-uniformly sampling a k-space. The MRI data is acquired by sampling over an entire k-space. The MRI data is acquired by sampling over half a k-space.

Other aspects include other combinations of the features recited above and other features, expressed as methods, apparatus, systems, program products, and in other ways. Other features and advantages will be apparent from the description and from the claims.

DESCRIPTION

Figure 1:
FIG. 1 shows an exemplary k-space dataset and its associated image.
Figure 1:
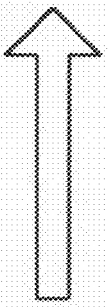
Figure 1:
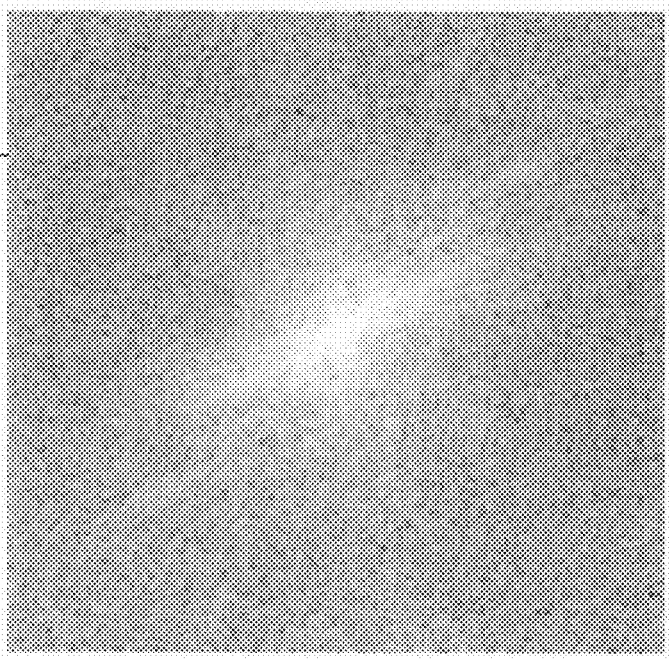
Figure 2:
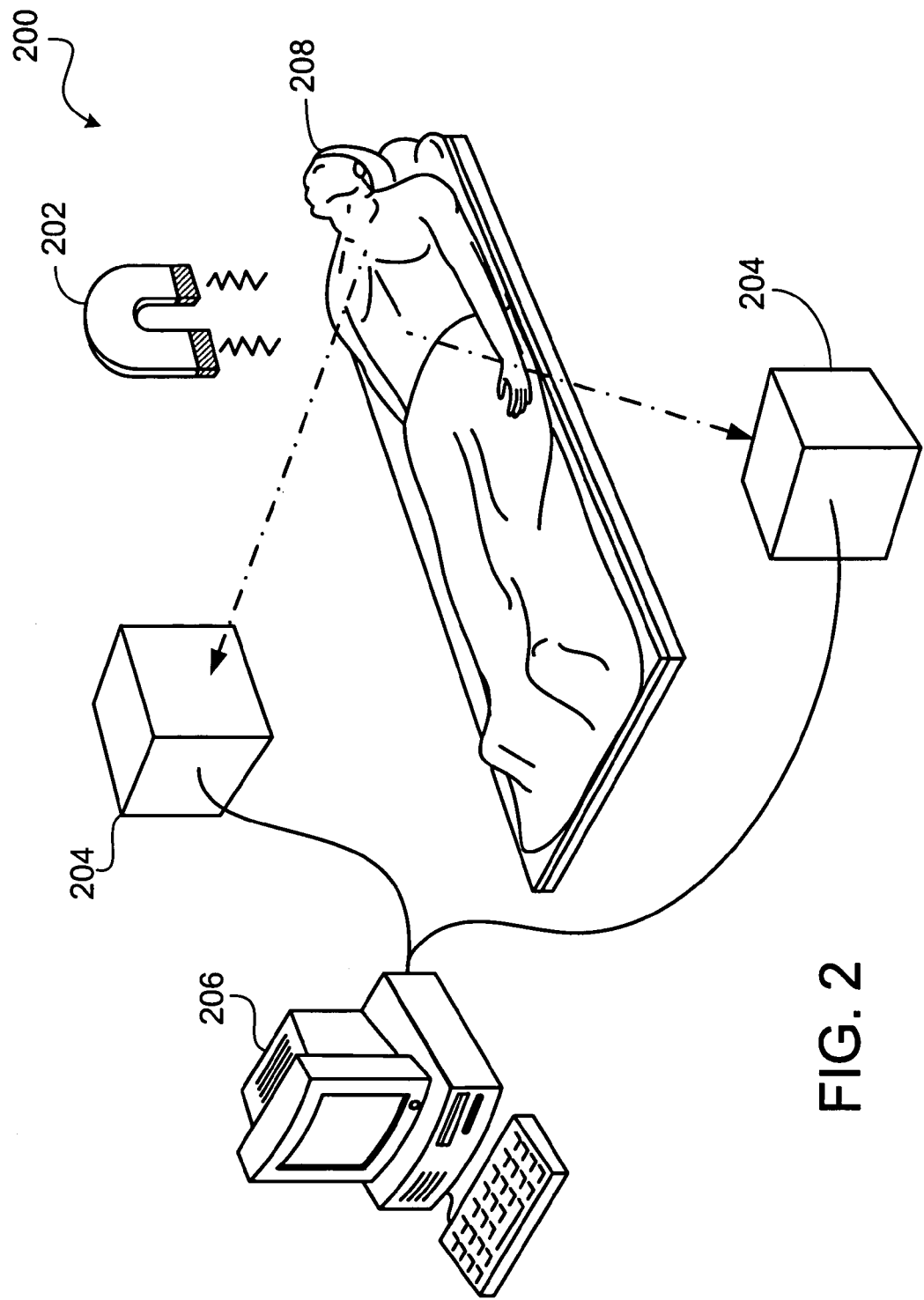
FIG. 2 is a schematic depiction of a magnetic resonance imaging machine

FIG. 2 shows a magnetic resonance imaging (MRI) machine 200 having a magnetic assembly 202 and detector coils 204. The detector coils 204 are in data communication with a computer 206. In operation, the magnetic assembly 202 generates a magnetic field, causing the hydrogen atoms in the water molecules in a patient 208 to undergo nuclear magnetic resonance (NMR). The water molecules subsequently emit photons 208 that are detected by each detector coil 204. Each detector coil 204 detects the emitted photons from various angles, and transmits the photon intensity it measures at a particular frequency and phase to the computer 206. Using this information, the computer 206 produces an image of the patient 208 or portion of the patient 202, which is recorded for display to a physician or MRI technician.

Although only two detector coils 204 are shown in FIG. 2, in principle any number of coils 204 may be used, including only one detector coil 204. Furthermore, although only one computer 206 is shown in FIG. 2, in principle any number of computers 206 cooperate to produce or display the image of the patient 202.

The computer 206 receives data provided by the MRI machine 200, and includes instruction to perform image reconstruction described below (see FIGS. 4 and 5) on the data. Additionally, the instructions may be stored on a computer-readable medium separate from the computer 206, such as a separate processor, magnetic or optical data storage device.

Figure 3A:
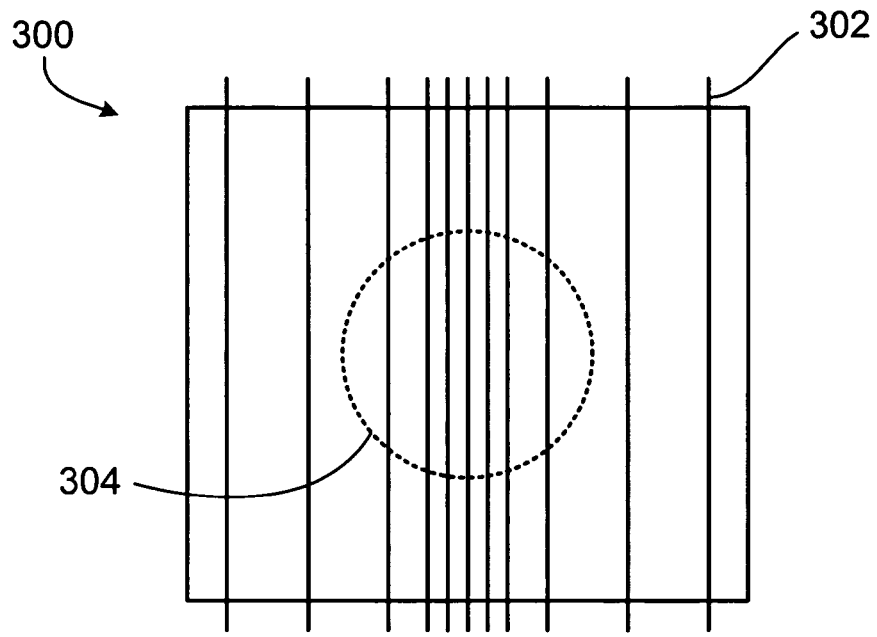
FIGS. 3A and 3B are exemplary k-space datasets.

FIG. 3a shows a schematic k-space dataset 300 constructed by irregular or non-uniform sampling. Each line 302 represents the amounts and relative phases of photons detected (or "sampled") at a particular frequency by a detector coil 204. Typically, a relatively high quality image can be constructed from a central region 304 of k-space. Thus, in some approaches, the k-space dataset 300 is sampled along lines 302 that are concentrated in the central region 304. Using non-uniform sampling allows for comparatively greater flexibility in manipulating artifacts inherent with subsampling, and provides easily self-referenced coil sensitivity data. However, some mathematical techniques for image reconstruction rely on uniform sampling, therefore those techniques would be inapplicable to this k-space dataset 300.

Figure 3B:
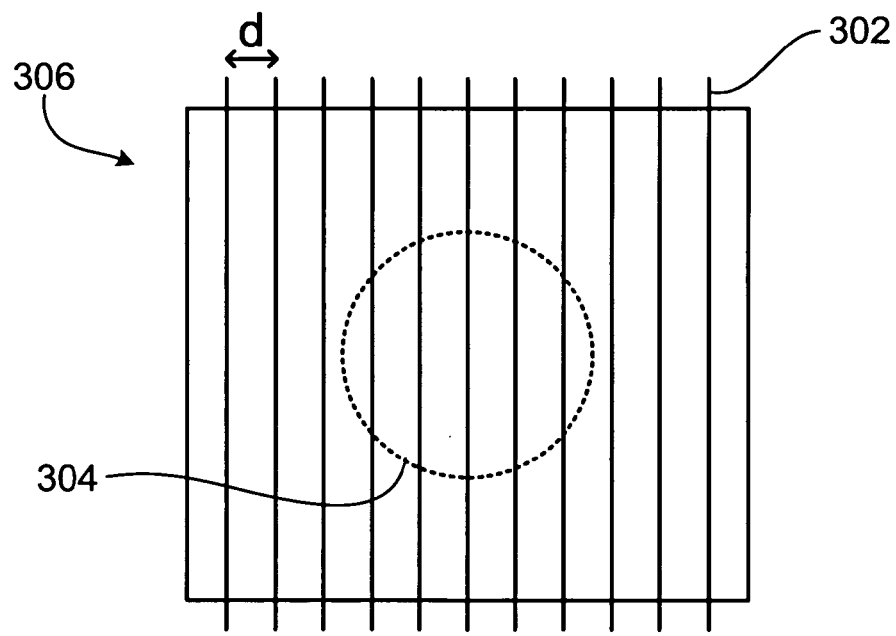

By contrast, FIG. 3b shows a k-space dataset 306 constructed by uniform sampling, using the same number of lines as in FIG. 3a. Each line 302 is a constant distance d away from its nearest neighboring line, but the central region 304 is sampled less frequently than in FIG. 3a. Thus, some mathematical techniques that rely on uniform sampling can be used to quickly produce an image from this k-space dataset 306.

Additionally, k-space datasets may have certain symmetries. For example, in certain cases, k-space datasets tend to have conjugate symmetry. In general, if a k-space dataset possesses such symmetry, then only a portion of the dataset need be acquired in order to recover the entire dataset. In the case of conjugate symmetry, for example, the entire k-space dataset may be reconstructed from a suitable half of the k-space dataset.

The techniques described below do not rely on any particular sampling strategy, and therefore can be used with any k-space dataset. Moreover, the techniques described below can be used on an entire k-space dataset, or half of a k-space dataset.

Theoretical Background

One can represent a k-space dataset as a vector or collection of vectors. Each sampled frequency is represented by a separate vector, whose dimension is equal to the phase resolution of the detector coil 204 that gathers data at that frequency. Each component of the vector represents the complex signal strength detected at the corresponding phase and frequency encoding. As a notational convention, all vectors are assumed to be column vectors, unless otherwise specified.

Reconstructing an image from a k-space dataset is equivalent to finding a vector $\rho$ that solves the minimization problem:

$$\min_\rho \|s - P\rho\|_2, \quad (1)$$

where s is an n-dimensional vector in the k-space dataset, P is an n×m matrix describing the phase and frequency encoding, along with estimates of the detector coils' sensitivities, $\rho$ is an m-dimensional vector containing the reconstructed image (or a portion thereof), and $\|\cdot\|_2$ is the $L^2$ norm. The maxtrix P is sometimes referred to as the system matrix. The dimension of s equals the number of distinct phases that can be detected by each detector coil 204, multiplied by the number of coils employed. The dimension of $\rho$ represents the resolution of the reconstructed image.

Typically, (e.g. at high sub-sampling rates) the dimensions of s, $\rho$, and P are such that the minimization problem (1) is ill-conditioned, and therefore solutions of (1) can be extremely sensitive to error or noise. For example, a solution $\rho$ of (1) may have the property that relatively slight changes in the acquired data results in relatively large changes in other solutions. One way to mitigate this sensitivity is to solve a "regularized" minimization problem:

$$\min_\rho \{\|s - P\rho\|_2^2 + \lambda^2 \|L\rho\|_2^2\}. \quad (2)$$

Here, L is a linear operator that is selected to impose a desired constraint on the solution $\rho$, and $\lambda$ is a real or complex scalar. Often, the choice of L depends on how the k-space data is acquired. If data over the full range of k-space is acquired, then typically, L=I, the identity operator.

In some embodiments, data over only half of k-space is acquired. Nevertheless, a full image can be recovered, based on symmetries that typically exist in k-space data, or based on known properties of solutions $\rho$. If data over only half of k-space is acquired, on can use a regularization parameter $\lambda$ and regularization operator L to separately constraint the real and imaginary part of the solution. On can then rewrite the minimization problem (2) as $$\min_\rho \left\{ \|s - P\rho\|_2^2 + \lambda_1^2 \left\| L \begin{bmatrix} \text{real}\{\rho\} \\ \text{imag}\{\rho\} \end{bmatrix} \right\|_2^2 \right\}, \quad (2')$$

where real $\{\rho\}$ denotes the real portion of $\rho$, and image $\{\rho\}$ denotes the imaginary portion of $\rho$. In some embodiments, L can be defined by $$L = \begin{bmatrix} I & 0 \\ 0 & cI \end{bmatrix}, \quad (2'')$$

where I is an identify operator of dimension equal to that of $\rho$, and $c=\lambda/\lambda$. This operation L acts nontrivially on the imaginary part of $\rho$. An operator L=(1/c)L can also be used to act on the real part of $\rho$. In this case, $\lambda_r$ should be replaced by $\lambda$ in equation (2'). With the choice of L as in equation (2''), the regularized minimization problem (2') has two parameters: $\lambda_r$ and c.

In general, other choices of L can be accommodated. If L is invertible, then the techniques described below can be applied by a transformation of variables. For example, one transformation of variables is to introduce the variable $\eta = L\rho$, or $\rho = L^{-1}\eta$. Reformulating minimization problem (2) or (2') in terms of $\eta$ eliminates the appearance of L, and the techniques described below can be used. In some implementations the system matrix can be considered to the $PL^{-1}$, as opposed to P.

The regularized minimization problem (2) can be thought of as seeking a solution to the original minimization problem (1), while simultaneously attempting to constrain the solution $\rho$. In this context, the "regularization parameter" $\lambda$ (or $\lambda_r$) represents the relative importance of finding a $\rho$ that minimizes (1) and controlling the norm of $\rho$. For example, if $\lambda$ is small, then a solution of (2) is close to a solution of (1). If used, the regularization parameter c represents the relative importance of adhering to the assumed symmetries in k-space.

Krylov Subspaces and Orthonormal Bases

Without any additional constraints, solving the minimization problem (2) is computationally intensive, in part due to the dimensions of s and $\rho$. The Krylov subspace techniques described below provide a way to project the minimization problem (2) to a smaller-dimensional subspace. This results in a more tractable minimization problem. To illustrate this process, we note that the minimization problem (2) is equivalent to solving:

$$(P^H P + \lambda^2 L^H L)\rho = P^H s, \quad (3)$$

wherein the exponent "H" denotes the Hermitian (or complex-conjugate) of a matrix. In what follows, we shall assume L=I, although the other case L≠I follows by employing a change of variables; e.g., $\eta = L\rho$, or $\rho = L^{-1}\eta$, to make the following observations applicable. Equation (3) is sometimes referred to as the "normal equations" corresponding to the minimization problem (2).

In general, given an n-dimensional vector v in a vector space V, and a linear operator T on V, the kth-order Krylov subspace of V generated by v and T is defined to be the linear vector space spanned by v and k−1 successive images of v under T; that is, $K_k(v, T) = \text{span}\{v, Tv, T^2v, \ldots, T^{k-1}v\}$. Where v and T are understood, the k-th order Krylov subspace is simply denoted $K_k$.

A Krylov subspace can be constructed based on s and P. Although the n×m matrix P is generally not a square matrix, the matrix $P^H P$ is always n×n. Thus, Krylov subspaces can be formed from the vector $P^H s$ and the operator $P^H P$. The kth-order Krylov subspace associated with the normal equations (3) (for $\lambda = 0$) is given by:

$$K_k = \text{span}\{P^H s, (P^H P)(P^H s), \ldots, (P^H P)^{k-1}(P^H s)\}. \quad (4)$$

With the k-th Krylov subspace identified, the minimization problem (1) and (2), or the normal equations (3) can be restricted to the k-th Krylov subspace. For example, minimization problem (1) restricts to:

$$\min_{\rho_k \in K_k} \|s - P\rho_k\|_2, \quad (5)$$

where $\rho_k$ denotes the solution obtained in the k-th Krylov subspace. One class to strategies for solving the restricted problems involves constructing an orthonormal basis of the Krylov subspace $K_k$. As described more fully below, this can be accomplished iteratively; that is, the orthonormal basis for $K_{k-1}$ can be used to construct the orthonormal basis of $K_k$.

Projecting to a Krylov Subspace with a CGLS-Constructed Basis.

One way to construct such an orthonormal basis involves conjugate-gradient least squares ("CGLS") techniques. Using these techniques, a matrix $V_k$ with columns $\{v, \ldots, v_k\}$ can be constructed such that: the columns of $V_k$ form an orthonormal basis of $K_k$; $\beta v = P^H s$ for some scalar $\beta$; and $$(P^H P) V_k = V_{k+3} \tilde{H}_k \quad (5)$$

for a (k+1)×k tridiagonal matrix $\tilde{H}_k$. Because $\tilde{H}_k$ is tridiagonal, equation (5) yields a three-term recurrence that can be used to construct the next column $v_k$ from the previous columns $v_{k-1}, v_{k-2}$. Thus, the columns of $V_k$ of need not be stored for all k, as k varies from iteration to iteration (see FIG. 4, step 414). Not storing un-necessary columns of $V_k$ saves computational resources.

If $\rho_k$ is a solution of equation (3) restricted to be in a Krylov subspace $K_k$, then $\rho_k$ factors as:

$$\rho_k = V_k y_k \quad (6)$$

for some coefficient vector $y_k$, because the columns of $V_k$ form an orthonormal basis of $K_k$. Inserting equation (6) into equation (3) and applying equation (5) yields:

$$((P^H P) + \lambda^2 I) V_k y_k = (V_{k-1} \tilde{H}_k + \lambda^2 V_k) y_k = \beta v_1. \quad (7)$$

To enforce the condition that the error between the vectors $\rho_k$ and $\rho$ is orthogonal to $K_k$, one multiplies (7) by $V^H$ to obtain:

$$(H_k + \lambda^2 I) y_k = \beta e_1. \quad (8)$$

where $H_k$ is the k×k leading tridiagonal submatrix of $\tilde{H}_k$, and $e_1 = V_{k+1}^H v_1$ is the first canonical unit vector. Equation (8) is referred to as the "projection" of equation (3) onto the kth-order Krylov subspace. Because $H_k$ is tri-diagonal, a three-term recurrence relation can be used to obtain solutions to equation (8) using only the solutions and orthonormal basis vectors from the previous three iterations. Obtaining the three-term recurrence relation is explained in Appendix A.

Projecting to a Krylov Subspace with LSQR-Constructed Basis.

One can also use least-square QR ("LSQR") techniques to construct a basis of the Krylov subspace $K_k$. As in the CGLS case described above, the vectors in this orthogonal basis are also denoted $\{v_1, \ldots, v_k\}$. It can be arranged that if these vectors are placed as columns in a matrix $V_k$, then the matrix $V_k$ satisfies the recurrence relation $$PV_k = U_{k+1} B_k, \quad (9)$$

where $B_k$ is a k+1×k bidiagonal matrix and $U_{k+1} = [u_1, \ldots, u_{k+1}]$ is a matrix with orthonormal columns such that $u_1 = s/\|s\|_2$. Similarly to the CGLS case, since the matrix $B_k$ is bidiagonal, the columns of $V_k$ (and $U_{k+1}$) can be generated from a two-term recurrence. Thus, the entire matrix $V_k$ (or $U_{k+1}$) is not needed to generated subsequent columns of the matrix as k increases—only the most recent two columns are needed. Not storing the entire matrices $V_k$ or $U_{k+1}$ can save computational resources.

Since $V_k$ describes a basis of $K_k$, the solution to equation (3) above is given by $\rho_k = V_k y_k$ for some appropriate coefficient vector $y_k$. Instead, for example, a solution $\rho_k$ may be constructed by using the bidiagonal nature of the $B_k$ matrix. In particular, using equation (4) and the equation $\rho_k = V_k y_k$, equation (3) can be written as $$\min_{y_k} \|s - PV_k y_k\|_2 = \min_{y_k} \| \|u_1\| s\|_2 - U_{k+1} B_k y_k\|_2 \quad (10)$$

$$= \min_{y_k} \|U_{k+1}(\beta e_1 - B_k y_k)\|_2 \quad (11)$$

$$= \min_{y_k} \|\beta e_1 - B_k y_k\|_2, \quad (12)$$

where $e_1$ is the first canonical unit vector of length k+1 in $B_k$, $\beta = \|s\|_2$, and the last equality follows from the fact that the $L^2$-norm is invariant under left multiplication by a matrix with orthonormal columns. Therefore, solving the minimization problem (3) has been reduced solving the minimization problem (12), which is a problem of smaller dimension.

Using this approach, $\rho_k$ is not formed from the product $V_k y_k$ explicitly: rather, the bidiagonal nature of $B_k$ is exploited to obtain $\rho_k$ from only the most recent iterates. Further, based on reasoning explained in Appendix A, one can also obtain values of the norms $\|s-P\rho_k\|_2$ and $\|\rho_k\|_2$ from short-term recurrences. As discussed more fully below, these norms can be used to select regularization parameters.

Image Reconstruction

Figure 4:
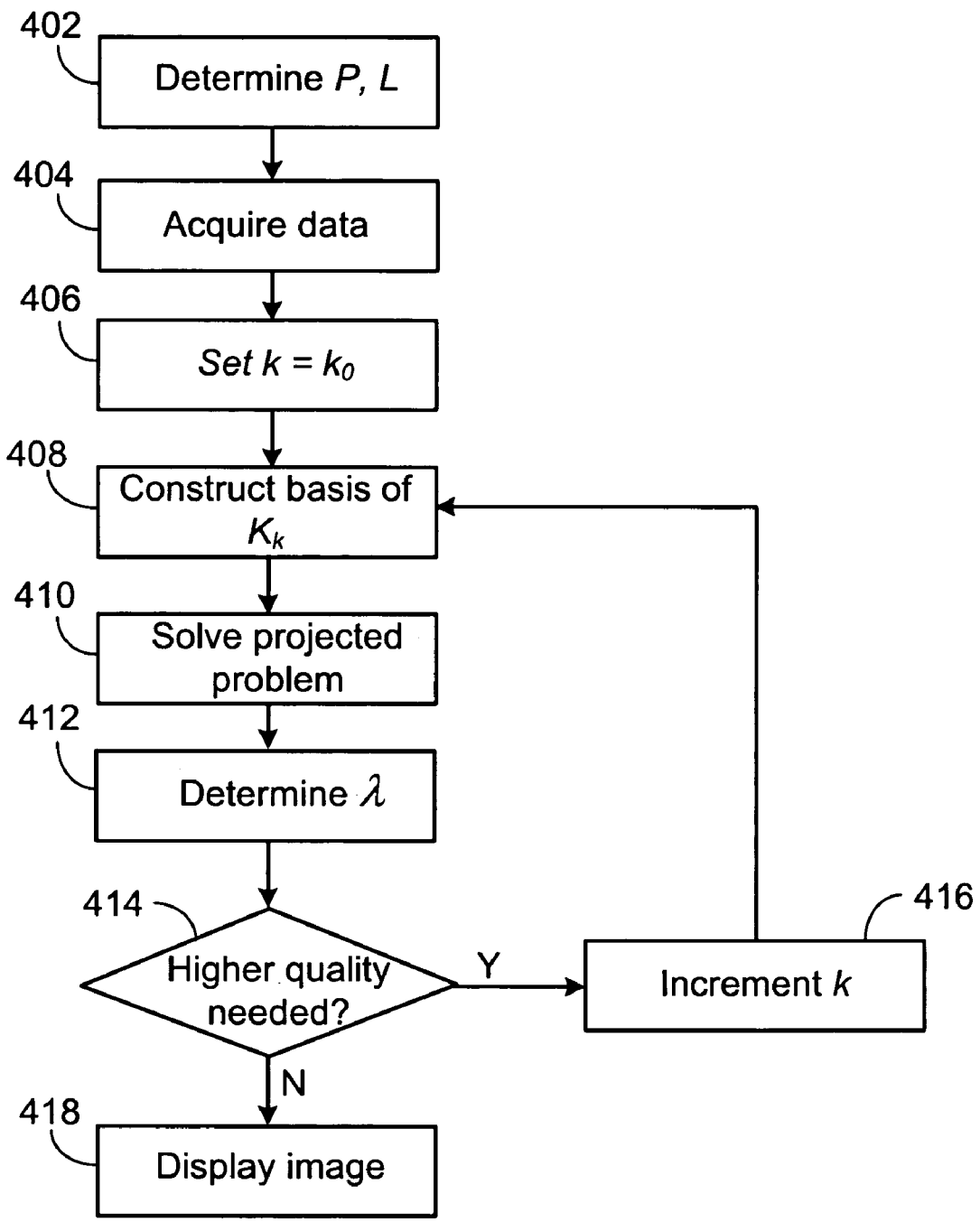
FIG. 4 is a flowchart describing image reconstruction.

Referring to FIG. 4, the above methods are used to reconstruct an image from a k-space dataset acquired by an MRI machine 200. Based on the characteristics of the MRI machine 200 (including, for example, the sensitivities of the detector coils 204), the system matrix P of equation (3) is determined (step 402). Then, based on any additional constraints on the image desired by a user, a matrix L in equation (3) is determined (step 402).

data is acquired from the MRI machine (step 404). To reconstruct the image, initially, a particular Krylov subspace of order $k_0$ is selected (step 406). With $k=k_0$, a basis $V_k$ according to equation (5) is constructed, for example by using conjugate-gradient least squares of LSQR techniques (step 408). Using the basis $V_k$, the "projected" image reconstruction minimization problem is formulated as in equation (8).

This minimization problem is solved, for example using the truncated singular value decomposition approach described in connection with equation (10) (step 410). The result is a solution of equation (3) that depends on $\lambda$, and possibly c. A particular value of $\lambda$ (and c, if necessary) is selected (step 412), as described below (see FIGS. 5 and 6). If a higher-quality image is needed (step 412), then k can be incremented (step 414), and the process starting from step 408 can be repeated using a higher-dimensional Krylov subspace. On the other hand, if the image is of acceptable quality, then it is displayed (step 416), for example on the computer 206. In some embodiments, an image is expected to be of acceptable quality based on the difference $\|\rho_{k+1} - \rho k\|_2$ of the solutions determined using k+1 and k-dimensional Krylov subspaces. In some embodiments, if this difference is less than $10^{-4}$, then the image is displayed.

Selection of Regularization Parameter(s)

Figure 5:
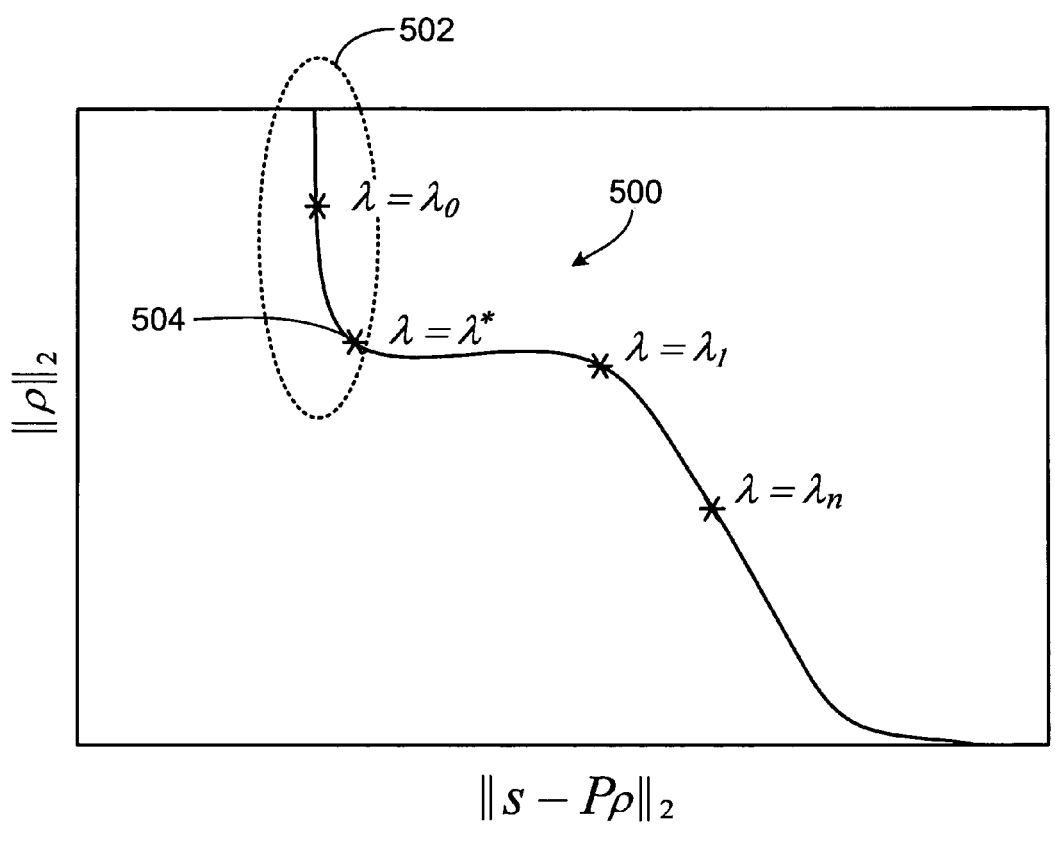
FIG. 5 is a schematic depiction of an L-curve.

Referring to FIG. 5, in the case where L=I in equation (3), one way to select a $\lambda$ for regularization involves the use of an L-curve 500 associated with the minimization problem (2). For many actual datasets, this curve has the general appearance of an "L," hence the name The L-curve 500 is obtained by plotting $\|\rho\|_2$ against $\|s-P\rho\|_2$ on a log-log scale, parameterized by $\lambda$. The L-curve 500 shown in FIG. 5 is schematic; it is neither drawn to scale, nor drawn to reflect an actual dataset from which an image is to be reconstructed. In FIG. 5 points on the L-curve 500 corresponding to $\lambda$ values $\lambda_0$, $\lambda^+$, $\lambda_1$, and $\lambda_n$ are plotted.

Typically, the L-curve 500 for parallel MRI reconstruction problems has a region 502 in which it is nearly vertical, and an inflection point 504. As $\lambda$ varies within region 502, $\|s-P\rho\|_2$ changes relatively slowly. Consequently, the resulting solutions to equation (3) are relatively stable. Thus, for image reconstruction, $\lambda$ is selected within region 502. Specifically, $\lambda$ is chosen by partitioning the $\lambda$-interval corresponding to the substantially vertical region 502 into subintervals $[\lambda_{n-1}, \lambda_n]$, and selecting $\lambda$ to be the largest $\lambda_n$ such that the condition:

$$|\|s-P\rho_{\lambda_{n-1}}\|_2 - \|s-P\rho_{\lambda_n}\|_2| < C \quad (13)$$

is satisfied for some threshold C, where $\rho_{\lambda_n}$ denotes the solution of equations (3) obtained using the regularization parameter $\lambda_n$. Alternatively, a logarithmic threshold can be used in condition (13) by taking the base-10 logarithm of each error term. Qualitatively, condition (13) expresses the notion that changing $\lambda$ results in a relatively small change in the error. Thus, qualitatively, $\lambda$ is selected as the largest $\lambda$ that produces an acceptably small change in the error.

In some examples, the logarithmic error threshold is chosen to be 0.01. The point $\lambda = \lambda^+$ schematically illustrates the location of a typical value satisfying the condition (13). A value of $\lambda$ that satisfies the condition (13) may be near the inflection point 504, but need not be coincident with it.

Once a value of $\lambda$ is fixed, then $\rho$ is an approximate solution of equations (3). This solution may subsequently be used to generate an image according to known techniques. When the iterations have converged to produce an image of sufficient quality, it is displayed (step 416 in FIG. 4).

Figure 6:
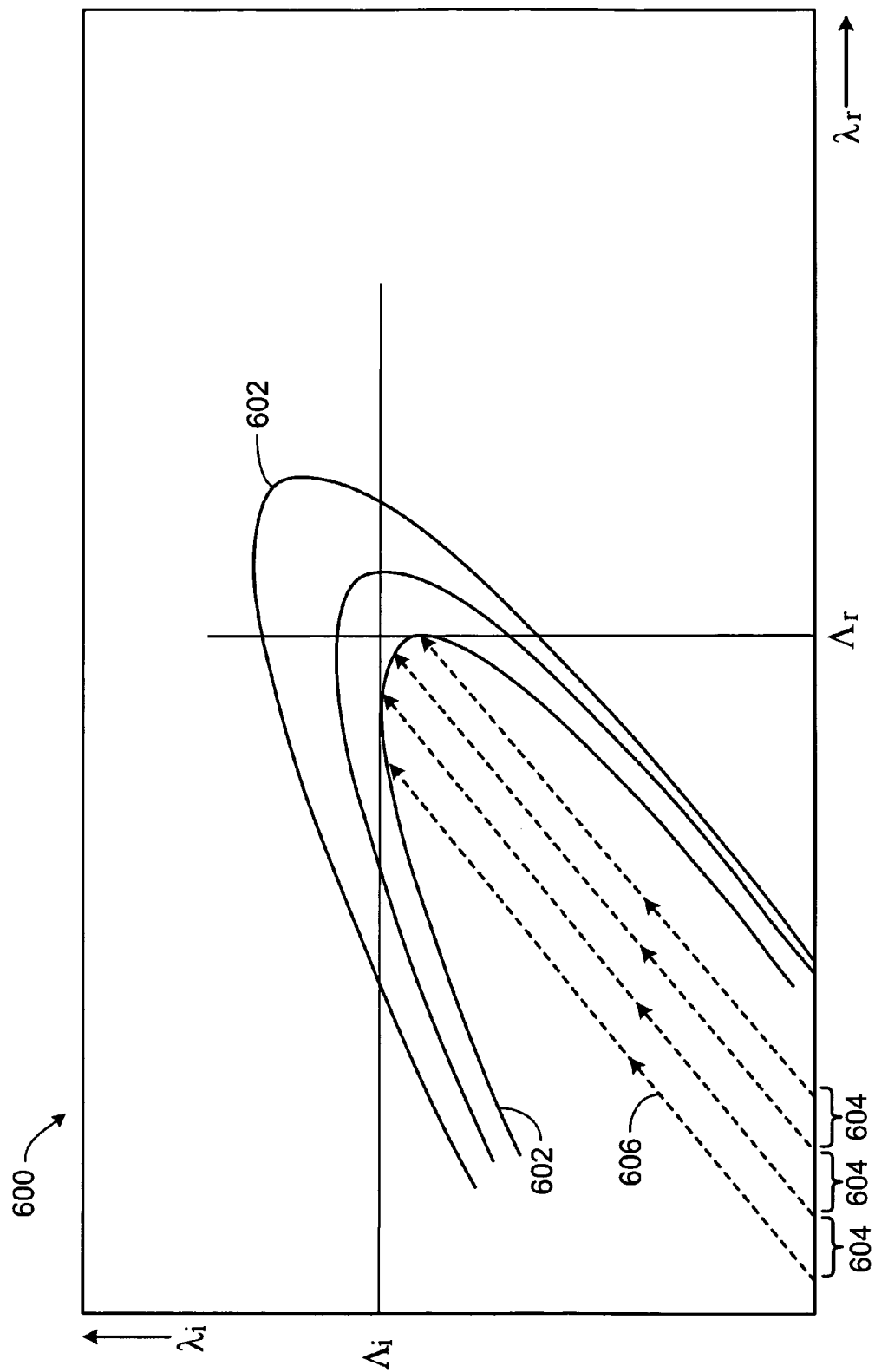
FIG. 6 is a schematic depiction of a contour plot.
Figure 7:
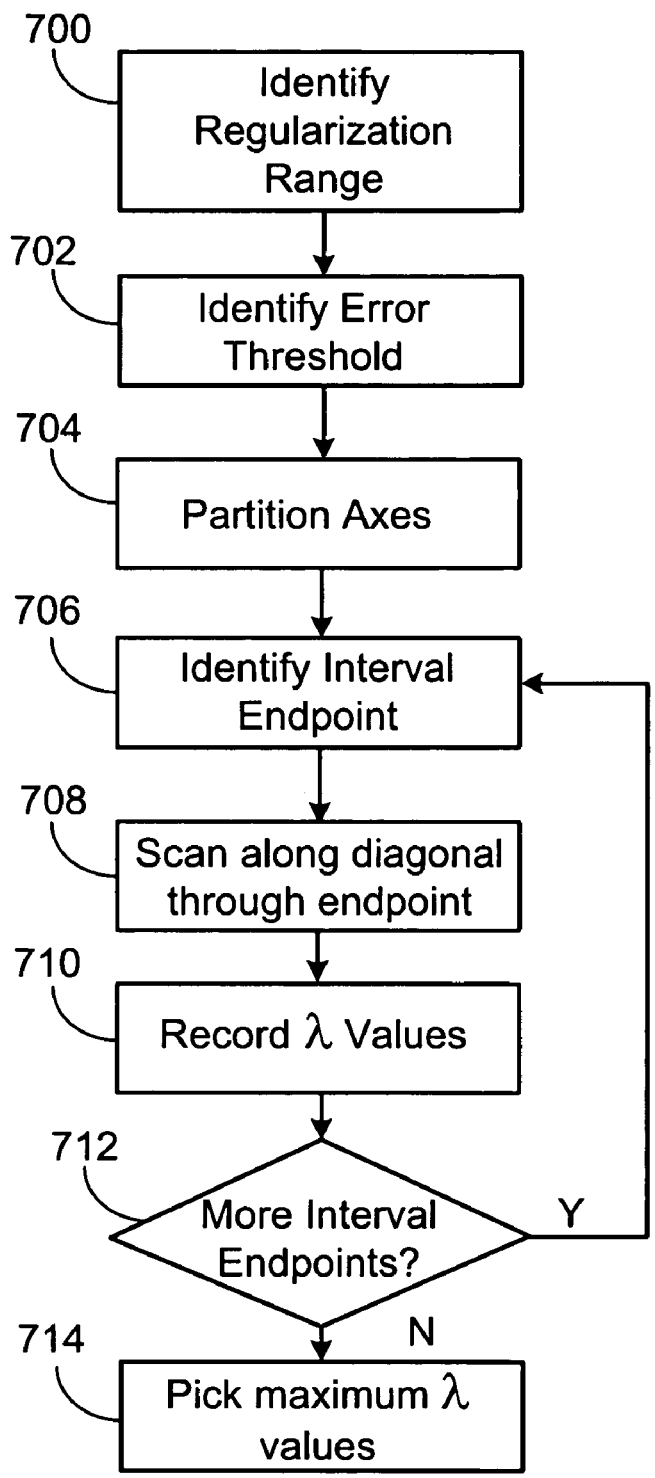
FIG. 7 is a flowchart describing selecting regularization parameters.

Referring to FIGS. 6 and 7, in the case when half of a k-space dataset is used, and when L is defined as in equation (2'), the error $\|s-P\rho\|_2$ is a function of two variables: $\lambda$ and $\lambda_r$. FIG. 6 shows a schematic contour plot 600 of this error. Each contour 602 represents a curve on which the error $\|s-P\rho\|_2$ is constant. Similarly to the full k-space setting described above, we (qualitatively) seek the largest regularization parameters that result in an acceptably small error. For example, the contour 602 corresponding to an acceptably small error is shown in a darkened line in FIG. 6. The maximum value of $\lambda$, along this contour 602 is denoted $\Lambda$, and the maximum value of $\lambda_i$ along this contour 602 is denoted $\Lambda_i$ in FIG. 6.

Referring to FIG. 7, one way to find these regularization parameters is as follows. First, a regularization range is identified (step 700). The regularization range is the anticipated range in which the desired values of the regularization parameters will fall. In some implementations, the regularization range is a two-dimensional rectangular region defined by two axes. For example, the regularization range may include axes for $\lambda_i$ and $\lambda_r$, or the regularization range may include axes for $\lambda_r$ and c. For convenience in what follows, axes for $\lambda_i$ and $\lambda_r$ are used.

In some implementations, the maximum value in the regularization range is based on the greatest singular value of the matrix P. For example, the maximum value in the regularization range may be equal to the greatest singular value of P, or may be a scalar multiple of the greatest singular value of P, the scalar multiple being based on the process by which P is determined from the detector coils 204.

The singular values of P often are distributed in two clusters, with each singular value in the first cluster being larger than each singular value in the second cluster. In some implementations, the minimum value in the regularization range is selected based on the greatest singular value in the second cluster. For example, the minimum value in the regularization range may be equal to the greatest singular value in the second cluster, or may be a scalar multiple of the greatest singular value in the second cluster, the scalar multiple being based on the process by which P is determined from the detector coils 204.

An error threshold is identified (step 702). This error threshold is analogous to the value C in equation (13). In some implementations, the logarithmic error threshold is equal to 0.01. In step 704, each axis in the regularization range (e.g., the $\lambda_i$ and $\lambda_r$ axes) is partitioned into intervals 604 (see FIG. 6). For example, each axis can be partitioned onto n intervals. In some embodiments, n is between 10 and 40.

An endpoint of an interval is selected (step 706). For example, the largest partition endpoint on the $\lambda_r$ axis. Starting from the endpoint selected in step 706, the error terms $\|s-P\rho\|_2$ are computed along a diagonal trajectory 606 (step 708). In FIG. 6, the arrows along each trajectory 606 illustrate the direction of the computation. In step 708, the error is computed along the trajectory 606 until the error equals or exceeds the error threshold identified in step 702. Computing the error term $\|s-P\rho\|_2$ along a diagonal trajectory, as opposed to a non-diagonal trajectory, is computationally inexpensive, because the Krylov subspace basis used to obtain $\rho$ differs only by a scalar along diagonal trajectories; that is, linear trajectories with 45-degree slope. Therefore, re-computing the Krylov-subspace basis need not be repeated along a diagonal trajectory 606. In FIG. 6, the level curve 602 corresponding to this energy threshold is shown in a darkened line. The values of $\lambda_r$ and $\lambda_i$ that cause the error $\|s-P\rho\|_2$ to equal or exceed the threshold are recorded (step 710).

It is determined whether interval endpoints exist that have not been used in the above steps (step 712). If such endpoints exist, steps 706-712 are repeated. In repeating steps 706-712, several values of $\lambda_r$ and $\lambda_i$ are recorded. Once all the interval endpoints have been identified, the maximum $\lambda_r$ and $\lambda_i$ of all those recorded in the various iterations of step 710 are used as regularization parameters.

Other embodiments are within the scope of the following claims.

APPENDIX A

In this appendix, certain recurrence relations and algorithms are described. The notation used in this appendix follows the MATLAB conventions, and follows that of Gene Golub and Charles Van Loan, "Matrix Computations," second edition, Johns Hopkins University Press, 1989. To the extent the MATLAB notation MATLAB and Matrix Computations is inconsistent, MATLAB notation governs.

LSQR Recurrence and Algorithm

The matrix recursions $PV_k = U_{k+1} B_k,$ $P^H U_{k+1} = V_k B_k^H + \alpha_{k+1} v_{k+1} e_{k+1}^r$ translate into the following matrix-vector (coupled two-term) recursions:

$\beta u_1 = s;$ $\beta_{i+1} u_{i+1} = A v_i - \alpha_i v_i;$ $\alpha_1 v_1 = P^H u_1;$ $\alpha_{i+1} v_{i+1} = P^H u_{i+1} - \beta_{i+1} v_1$ where $\alpha_i$ and $\beta_i$ indicate scalar normalization constants.

$$\|P\rho_k - s\|_2^2 + \|\lambda^2 \rho_k\|_2^2 = \left\| \begin{bmatrix} B_k \\ \lambda \end{bmatrix} y_k - \beta e_1 \right\|_2^2 \quad (1)$$

for any $\lambda$. To minimize the functional on the right of the equation (1), one can use a QR factorization. However, the stacked matrix on the right is sparse, and because $B_k$ differs from $B_{k-1}$ only in the addition of a new row and column, the factorization at step k requires only a few additional Givens (plane) rotations. For notational convenience in the QR factorization described below, the dependence on $\lambda$ will be suppressed.

To solved equation (1), the QR factorization is applied to the augmented matrix as follows:

$$Q_k \begin{bmatrix} B_k & \beta e_1 \\ \lambda 1 & 0 \end{bmatrix} = \begin{bmatrix} R_k & f_k \\ 0 & \bar{\phi}_{k+1} \\ 0 & q_k \end{bmatrix},$$

where $Q_k$ is an orthonormal k×k matrix, $R_k$ is an upper bidiagonal k×k matrix, and otherwise the notation follows LSQR: An Algorithm for Sparse Linear Equations and Sparse Least Squares, ACM Transactions on Mathematical Software, Vol. 8, No. 1, Mar. 1982, pp. 43-71; Vol. 8, No. 2 June 1982, pp. 195-209. By the relationship of $B_k$ to $B_{k-1}$, the matrix $Q_k$ is a product of $Q_{k-1}$ (augmented by $e_k$ in the last row) and plane rotations that "zero-out" the new last row in $B_k$, as well as the extra $\lambda$ in the last row of the stacked matrix.

This yields $R_k y_k = f_k$ as the solution to the minimization problem on the right in equation (1). However, the recursion for $\rho_k$ can be obtained by the fact that $\rho_k = V_k y = D_k f_k$, where $R_k y_k = f_k$ is the solution to the minimization problem. The columns of $D_k$ are obtained from the fact that $R_k^T D_k^T = V_k^T$, and that $R_k^T$ is lower bidiagonal. Thus, solving for the last row of $D_k^T$ depends only on $d_{k-1}$ and $v_k$. This allows $\rho_k$ to be obtained from a linear combination of $\rho_{k-1}$ and $d_k$.

By way of example, in the case k=2, the augmented matrix is transformed through four plane rotations as:

$$\begin{bmatrix} \alpha_1 & 0 & \beta_1 \\ \beta_2 & \alpha_2 & 0 \\ 0 & \beta_3 & 0 \\ \lambda & 0 & 0 \\ 0 & \lambda & 0 \end{bmatrix} \rightarrow \begin{bmatrix} \tau_1 & \theta_2 & \phi_3 \\ 0 & \tau_2 & \phi_2 \\ 0 & 0 & \phi_3 \\ 0 & 0 & \psi_1 \\ 0 & 0 & \psi_2 \end{bmatrix}.$$

For k=3, the augmented matrix transform as:

$$\begin{bmatrix} \alpha_1 & 0 & 0 & \beta_1 \\ \beta_2 & \alpha_2 & 0 & 0 \\ 0 & \beta_3 & \alpha_3 & 0 \\ 0 & 0 & \beta_4 & 0 \\ \lambda & 0 & 0 & 0 \\ 0 & \lambda & 0 & 0 \\ 0 & 0 & \lambda & 0 \end{bmatrix} \rightarrow \begin{bmatrix} \tau_1 & \theta_2 & 0 & \phi_1 \\ 0 & \tau_2 & \theta_3 & \phi_2 \\ 0 & 0 & \tau_3 & \phi_3 \\ 0 & 0 & 0 & \bar{\phi}_4 \\ 0 & 0 & 0 & \psi_1 \\ 0 & 0 & 0 & \psi_2 \\ 0 & 0 & 0 & \psi_3 \end{bmatrix}.$$

To obtain a recurrence for $\|\rho k\|_2$, write $$\rho_k = V_k R_k^{-1} f_k = V_k \overline{Q}_k^T \overline{z}_k$$

where $R_k \overline{Q}_k^T = \overline{L}_k$ is the reduction of $R_k$ to lower bidiagonal form through plane rotations, and $\overline{z}_k$ solves $\overline{L}_k = \overline{z}_k f_k$. Since $V_k$ and $\overline{Q}_k^T$ are orthonormal, $\|x_k\|_2 = \|\overline{z}_k\|_2$.

For the norms of the residual, $\|P\rho_k - s\|_2$, note that $$\|P\rho_k - s\|_2^2 = \left\| \begin{bmatrix} B_k \\ \lambda \end{bmatrix} y_k - \beta e_1 \right\|_2^2 - \lambda^2 \|\rho_k\|_2^2.$$

However, an estimate of the first term on the right is given by $$\left\| \begin{bmatrix} B_k \\ \lambda \end{bmatrix} y_k - \beta e_1 \right\|_2^2 \approx \bar{\phi}_{k+1}^2 + \|q_k\|_2^2,$$

where the vector $q_k$ differs from the previous $q_{k-1}$ only in the last component. Thus, $\|q_k\|_2^2$ can be computed from $\|q_{k-1}\|_2^2 + \psi_k^2$.

Algorithm LSQR for Complex $\lambda$

---

Initialization:

$\beta = \|s\|$; $u = s/\beta$;
$t = P^H u$; $\alpha = \|t\|$; $v = t/\alpha$;
$\rho = 0$; $w = v$;
$\overline{\Phi} = \beta$; $\overline{\tau} = \alpha$;
res2 = 0; $\rho = 0$; $c_2 = -1$; $d_2 = 0$;
Main loop: for $i = 1$ to maxits $t = P*v - \alpha*u$; $\beta = \|t\|$; $u = t/\beta$;
$t = P^{H}*u - \beta*v$; $\alpha = \|t\|$; $v = t/\alpha$;
$\tilde{\tau} = \text{norm}([\overline{\tau}, \lambda])$;
$\hat{c} = \text{conj}(\overline{\tau})/\tilde{\tau}$; $\hat{d} = \lambda/\tilde{\tau}$;
$\tilde{\phi} = \hat{c}*\overline{\Phi}$;
$\psi = \text{conj}(\hat{d})*\overline{\Phi}$;
$\tau = \text{norm}([\tilde{\tau}, \beta])$;
$c = \text{conj}(\tilde{\tau})/\tau$; $d = \text{conj}(\beta)/\tau$;
$\theta = d*\alpha$;
$\overline{\tau} = -\text{conj}(c)*\alpha$;
$\Phi = c*\tilde{\phi}$;
$\overline{\Phi} = \text{conj}(d)*\tilde{\phi}$;
$\rho = \rho + (\Phi/\tau)*w$;
$w = v - (\theta/\tau)*w$;
$\delta = d_2 * \tau$; $\overline{\gamma} = -c_2*\tau$; $h = \Phi - \delta*z$;
$\overline{z} = h/\overline{\gamma}$;
$\rho_{norm} = \sqrt{\rho + \overline{z}^{\nabla 2}}$;
$\gamma = \text{norm}([\overline{\gamma}, \theta])$;
$c_2 = \overline{\gamma}/\gamma$; $d_2 = \theta/\gamma$; $z = h/\gamma$;
$\rho = \rho + z^2$;
res1 = $\Phi^2$; res2 = res2 + $\psi^2$;
$R_2 = (\text{res1} + \text{res2})^{1/2}$;
Resnorm = $\sqrt{R_2^2 - \lambda^2 * \rho_{norm}^2}$.

---

Conjugate-Gradient Recurrence and Algorithm:

The matrix recurrence relations $$P^H P V_k = V_{k+1} H_k = V_k \overline{H}_k + g_k e_k^T,$$

where $g_k = [0, \ldots, 0, \beta_k]$ and $e_k$ is the kth canonical unit vector, can be re-written as $$(P^H P + \lambda^2 I) V_k = V_k (\tilde{H}_k + \lambda^2 I) + g_k e_k^T.$$

since the matrix $T_k = (\overline{H}_k + \lambda^2 I)$ is tridiagonal and Hermitian positive definite, $T_k$ can be factored as:

$$T_k = L_k D_k L_k^H$$

where $L_k$ and $D_k$ are defined by:

$$L_k = \begin{pmatrix} 1 & 0 & \cdots & 0 \\ \mu_1 & 1 & \cdots & 0 \\ \vdots & \ddots & \ddots & \vdots \\ 0 & \cdots & \mu_{k-1} & 1 \end{pmatrix}; \quad D_k = \begin{pmatrix} d_1 & 0 & \cdots & 0 \\ 0 & d_2 & \cdots & 0 \\ \vdots & \ddots & \ddots & \vdots \\ 0 & \cdots & 0 & d_k \end{pmatrix}.$$

The entries $\mu_1$ and $d_i$ in $L_k$ and $D_k$ depend on $\lambda$, but that dependence has been suppressed for notational convenience.

Note that the entries of $L_k$, $D_k$ differ from the entries in $L_{k-1}$, $D_{k-1}$ respectively only in the last row and column of each matrix. Thus, the matrix recurrence above can be written as a matrix-vector recurrence by equating like columns, obtaining:

$$\beta_{k-1} v_k = -\text{conj}(\beta_{k-2}) v_{k-2} + P^H(Pv_2) - \alpha_2 v_2,$$

where the $\beta_i$ terms are the normalization constants located on the subdiagonal of $T_k$, their conjugates are on the superdiagonal of $T_k$, and the $\alpha_i$ terms are on the main diagonal of $T_k$. Therefore, the recursion for the entries of $L_k$ and $D_k$ is given by:

$$\mu_{t-1} = \beta_{t-1}/d_{t-1},$$

$$d_t = \alpha_t - |\mu_{t-1}|^2 * d_{t-1},$$

with initial condition $d_1 = \alpha_1$.

Define $C_k = V_k L_k^{-H}$ and let $p_k$ be the solution to $L_k D_k p_j = \beta e_1$. Now $$\rho_k = V_k y_k = V_k T_k^{-1} \beta e_1 = (V_k L_k^{-H}) D_k^{-1} L_k^{-1} \beta e_1 = C_k p_k.$$

From the definition of $C_k$, we have $$L_k C_k^T = V_k^T,$$

so the lower bidiagonal structure of $L_k$ gives the recurrence $$c_k = v_k - \mu_{k-1} c_{k-1}.$$

Writing $p_k = [\phi_1, \ldots, \phi_k]^T$, we have $$\begin{pmatrix} L_{k-1} D_{j-1} & 0 \\ 0 \ldots 0 \mu_{k-1} d_{k-1} & d_k \end{pmatrix} \begin{pmatrix} \phi_1 \\ \vdots \\ \phi_k \end{pmatrix} = \beta e_1.$$

However, because $L_{k-1} D_{k-1} p_j = \beta e_1$, we have $p_k = [p_{k-1}; \phi_k]$, so that $$\phi_1 = \beta/d_1$$

$$\phi_k = -(\mu_{k-1} d_{k-1} \phi_{k-1})/d_{k-1}$$

from which it follows that $$\rho_k = C_k p_k = C_{k-1} p_{k-1} + \phi_k c_k = \rho_{k-1} + \phi_k c_k.$$

Using the relations above, the residual norm of the regularized equations can be written as:

$$\|(P^H P + \lambda^2 I)\rho_k - P^H s\|_2 = |\beta_k| |e_k^T y| = |\beta_k| |\phi_k|,$$

since $y_k$ is a solution to $L_k^H y_k = p_k$.

Conjugate Gradient Algorithm (Complex $\lambda$)

---

Initialization:

$r = P^H s;$
$\beta = \|r\|_2$
$v = \rho = 0;$
$k = 0;$
Main loop:

$v_{new} = r/\beta;\ t = [P;\ \lambda^*1]^* v_{new};\ \alpha\ t^{H*}t;\ k = k + 1;$
$r = [P^H,\ \lambda^*1]^* t - \alpha^* v_{new} - \beta^* v$
$\beta_{new} = \|r\|^2$
if k = 1
    $d = \alpha;\ c = v_{new};\ \Phi = \beta / \alpha;\ \rho = \Phi^* v_{new};$
else
    $\mu = \beta/d;\ d_{new} = \alpha - d^*\mu^*\text{conj}(\mu);$
    $c = v_{new} - \mu^* c;$
    $\Phi = -\mu^* d^* \Phi/d_{new};$
    $\rho = \rho + \Phi^* c;\ d = d_{new}$
$v = v_{new};\ \beta = \beta_{new}.$

---

What is claimed is:

1. A method of reconstructing an image from MRI data provided by an MRI machine, the method comprising:
   selecting a system transformation based on the MRI machine;
   selecting a subspace based on the system transformation;
   selecting a first regularization parameter and a second regularization parameter from an interval, wherein the interval is based on a singular value spectrum of the system transformation;
   obtaining a solution vector using the first and second regularization parameters, wherein the solution vector solves a minimization problem formulated on the subspace based on the MRI data; and
   displaying the image reconstructed from the solution vector.

2. The method of claim 1, further comprising estimating a sensitivity of a receiving coil in the MRI machine, and selecting the system transformation includes selecting the system transformation based on the sensitivity.

3. The method of claim 2, in which selecting the system transformation also includes selecting the system transformation based on a sampling pattern used by the MRI machine.

4. The method of claim 1, in which obtaining a solution vector includes selecting a regularization parameter, and the subspace is selected independently of the regularization parameter.

5. The method of claim 1, further comprising selecting a basis of the subspace.

6. The method of claim 5, wherein the basis is selected using a conjugate-gradient least-square technique.

7. The method of claim 5, wherein the basis is selected using an least-squares QR technique.

8. The method of claim 5, in which obtaining a solution vector includes selecting a regularization parameter, and the basis is selected independently of the regularization parameter.

9. The method of claim 1, in which the subspace consists of a Krylov subspace.

10. The method of claim 1, in which obtaining a solution vector includes using an LSQR algorithm.

11. The method of claim 1, in which obtaining a solution vector includes using a conjugate-gradient algorithm.

12. The method of claim 1, further comprising selecting a regularization parameter corresponding to a substantially vertical portion of an L-curve.

13. The method of claim 1, wherein the first regularization parameter corresponds to a real part of the solution vector, and the second regularization parameter corresponds to an imaginary part of the solution vector.

14. The method of claim 1, wherein the first regularization parameter and the second regularization parameter are selected as maximum parameters yielding a pre-determined error.

15. The method of claim 1, wherein the interval consists of numbers between $10^2$ and $10^6$.

16. The method of claim 1, wherein the MRI data is acquired by uniformly sampling a k-space.

17. The method of claim 1, wherein the MRI data is acquired by non-uniformly sampling a k-space.

18. The method of claim 1, wherein the MRI data is acquired by sampling over an entire k-space.

19. The method of claim 1, wherein the MRI data is acquired by sampling over half a k-space.

20. A non-transitory computer-readable medium for use in reconstructing an image from MRI data provided by an MRI machine, the medium bearing instructions causing a computer to:
   select a system transformation based on the MRI machine;
   select a subspace based on the system transformation;
   select a first regularization parameter and a second regularization parameter from an interval, wherein the interval is based on a singular value spectrum of the system transformation;
   obtain a solution vector using the first and second regularization parameters, wherein the solution vector solves a minimization problem formulated on the subspace based on the MRI data; and
   display the image reconstructed from the solution vector.

21. The computer-readable medium of claim 20, in which the instructions further cause the computer to estimate a sensitivity of a receiving coil in the MRI machine, and to select the system transformation based on the sensitivity.

22. The computer-readable medium of claim 21, in which the instructions further cause the computer to select the system transformation based on a sampling pattern used by the MRI machine.

23. The computer-readable medium of claim 20, in which the instructions to cause the computer to obtain a solution include instructions causing the computer to select a regularization parameter, wherein the instructions further cause the computer to select the subspace independently of the regularization parameter.

24. The computer-readable medium of claim 20, in which the instructions further cause the computer to select a basis of the subspace.

25. The computer-readable medium of claim 24, in which the instructions cause the computer to select the basis using a conjugate-gradient least-square technique.

26. The computer-readable medium of claim 24, in which the instructions cause the computer to select the basis using a least-squares QR technique.

27. The computer-readable medium of claim 24, in which the instructions for obtaining a solution vector include instructions for selecting a regularization parameter, wherein the instructions cause the computer to select the basis independently from the regularization parameter.

28. The computer-readable medium of claim 20, in which the subspace consists of a Krylov subspace.

29. The computer-readable medium of claim 20, in which the instructions that cause the computer to obtain the solution vector include a least-squares QR algorithm.

30. The computer-readable medium of claim 20, in which the instructions that cause the computer to obtain the solution vector include a conjugate-gradient algorithm.

31. The computer-readable medium of claim 20, in which the instructions further include instructions for selecting a regularization parameter corresponding to a substantially vertical portion of an L-curve.

32. The computer-readable medium of claim 20, in which the first regularization parameter corresponds to a real part of the solution vector, and the second regularization parameter corresponds to an imaginary part of the solution vector.

33. The computer-readable medium of claim 20, wherein the instructions cause the computer to select the first regularization parameter and the second regularization parameter as maximum parameters yielding a pre-determined error.

34. The computer-readable medium of claim 20, wherein the interval consists of numbers between $10^2$ and $10^6$.

35. The computer-readable medium of claim 20, wherein the MRI data is acquired by uniformly sampling a k-space.

36. The computer-readable medium of claim 20, wherein the MRI data is acquired by non-uniformly sampling a k-space.

37. The computer-readable medium of claim 20, wherein the MRI data is acquired by sampling of an entire k-space.

38. The computer-readable medium of claim 20, wherein the MRI data is acquired by sampling over half a k-space.

* * * * *